Figure 1:
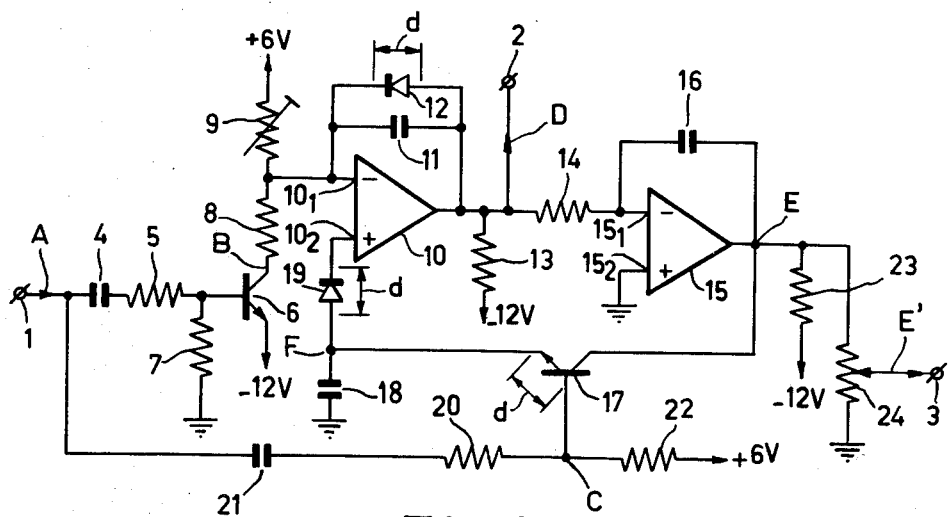

United States Patent [19]

Tiemeijer

[11] 4,064,406
[45] Dec. 20, 1977

[54] GENERATOR FOR PRODUCING A SAWTOOTH AND A PARABOLIC SIGNAL
[75] Inventor: Robert Tiemeijer, Eindhoven, Netherlands
[73] Assignee: U.S. Philips Corporation, Briarcliff Manor, N.Y.
[21] Appl. No.: 708,865
[22] Filed: July 26, 1976
[30] Foreign Application Priority Data
Aug. 11, 1975 Netherlands .................. 7509525
[51] Int. Cl.² .......................... H03K 4/08; H03K 4/84
[52] U.S. Cl. .................................... 307/228; 315/371; 315/399; 328/187
[58] Field of Search ............... 315/364, 371, 387, 389, 315/399, 409; 307/229, 230, 228; 328/127, 181, 187

[56] References Cited
U.S. PATENT DOCUMENTS
3,715,487 2/1973 Blake ..................... 328/127
3,725,726 4/1973 West ..................... 307/228
3,986,127 10/1976 Ray ..................... 328/127

Primary Examiner—Maynard R. Wilbur
Assistant Examiner—T. M. Blum
Attorney, Agent, or Firm—Frank R. Trifari; Henry I. Steckler

[57] ABSTRACT

A generator suitable for producing a sawtooth and a parabolic signal for the line or field deflection in a television system. The generator is provided with two dc coupled, series-connected difference amplifiers with feedback, which are each part of an associated integrating circuit. Via a peak detection circuit the output of the second difference amplifier is connected to the non-inverting input of the first difference amplifier. The second integrating circuit has been rated in such a way that the peak-peak value of the parabolic signal is half that of the sawtooth signal, while independent of the peak-peak value adjustment the ground potential is present in both signals in the center of trace; consequently there are no centering difficulties.

6 Claims, 2 Drawing Figures

GENERATOR FOR PRODUCING A SAWTOOTH AND A PARABOLIC SIGNAL

The invention relates to a generator for producing a sawtooth and a parabolic signal, provided with a first and a second integrating circuit D.C. coupled, each comprising a difference amplifier and a capacitor in a feedback path from an output to an inverting input of the difference amplifier, the output of the difference amplifier in the second integrating circuit being fed back to an input of the difference amplifier in the first integrating circuit.

Such a generator is described in U.S. Pat. No. 3,725,726. It has been indicated that the output of the difference amplifier of the second integrating circuit which carries the parabolic signal is connected in the feedback circuit to the base of a transistor whose emitter is connected to earth through a resistor and whose collector is connected through a resistor to the inverting input of the difference amplifier in the first integrating circuit and through another resistor to a power supply terminal. The non-inverting input of this difference amplifier is connected through a resistor to a terminal having a bias voltage. For obtaining the sawtooth signal at the output of the difference amplifier of the first integrating circuit and, superimposed, the parabolic signal obtained through the feedback circuit, the emitter-collector path of the transistor is connected parallel with the capacitor of said amplifier, the base of this transistor being driven by switching pulses. It has been indicated that, owing to the described connections a sawtooth signal having a parabolic correction can be produced, which can be used as deflection signal for cathode-ray tubes. When switching pulses occur at a repetition frequency which is equal to the line or the field frequency of the television system, the signal produced is suitable for use for the line or field deflection in television tubes. It is furthermore indicated that the parabolic correction yields a linear deflection with no D.C. component occurring in the signal produced, that is to say the signal is centered around the ground potential because the non-inverting input of the difference amplifier in the second integrating circuit is connected to ground through a resistor.

The generator according to the invention has for its object to produce, whilst using the described feedback principle for obtaining a sawtooth signal having a D.C. component equal to zero or to another reference potential, simultaneously a separate parabolic signal which signals are each adjustable to enable their use with, for example, television cameras provided with a plurality of camera tubes. To that end the generator according to the invention is characterized in that the output of the difference amplifier in the second integrating circuit is connected via a peak detection circuit to a non-inverting input of the difference amplifier in the first integrating circuit.

To achieve that not only the sawtooth signal produced has a D.C. component at a given reference potential but that therewith the parabolic signal has for an instant the reference potential when this is also present for the same instant in the sawtooth signal, the generator according to the invention is characterized in that by the rating of the second integrating circuit the peak to peak value of the parabolic signal during the trace portion of the sawtooth, which signal is present at a generator output, is substantially half that of the sawtooth signal present at an other generator output, and that the non-inverting input of the difference amplifier in the second integrating circuit is connected directly to a reference potential.

A further generator according to the invention which is characterized in that the said reference potential is the ground potential has the advantage that in the absence of a D.C. component in the sawtooth signal the parabolic signal has the ground potential when it also occurs for an instant in the sawtooth signal, so that another adjustment of the sawtooth amplitude which is accompanied by a change in the amplitude of the parabola does not exercize any influence on the instantaneous occurrence of the ground potential in the sawtooth and parabolic signal. This will cause no centering problems when used in a deflection circuit.

It should be noted that it is in itself known from U.S. Pat. No. 3,715,487 to connect, in an integrating circuit provided with the capacitively fedback difference amplifier, the output of this difference amplifier to a non-inverting amplifier input through an invertor circuit and a peak detection circuit. Applied here is a single integrating circuit and not two D.C. coupled integrating circuits, connected in series and which can each be separately adjusted, each having an own capacitively fed back difference amplifier and in which the peak detection circuit is applied between the output of the second integrating difference amplifier and the non-inverting output of the first integrating difference amplifier. Furthermore, by means of a suitable rating of the second integrating circuit so that the peak to peak value of the parabolic signal is half that of the sawtooth signal, it can be achieved that the peak to peak value adjustment does not result in a centering change.

Figure 2:
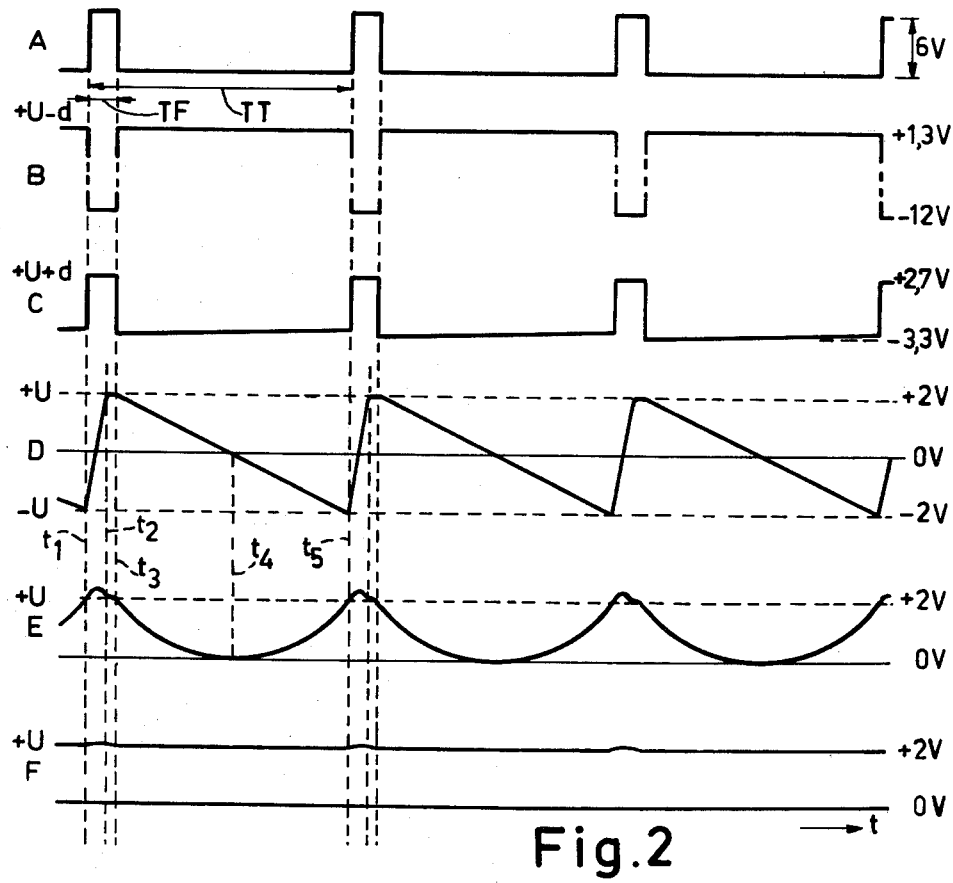

The invention will be explained with reference to the following Figures which are given by way of non-limitative example, in which:

FIG. 1 is a circuit diagram of an embodiment of the generator according to the invention and FIG. 2 shows signals occurring as a function of time at the generator according to FIG. 1.

FIG. 1 shows an embodiment of a generator according to the invention for producing, whilst a pulse-shaped signal A is applied to an input 1, a sawtooth signal D at a first output 2 and a parabolic signal E' at a second output 3. To explain the operation of the generator according to FIG. 1 some signals A, B, C, D, E and F have been plotted as a function of time $t$ in FIG. 2. The pulse-shaped signal A applied to the input 1 is shown in FIG. 2 with a peak to peak value of 6 V. By TT at the signal A a period has been plotted which, when the generator according to FIG. 1 is used in a television system, is equal to a line period or a field period depending on the application of the generator in a line deflection or field deflection circuit. Depending on the television system the line period (TT) is, for example, 64 or 63.5 $\mu$s for a line deflection generator embodiment, the field period (TT) being 20 or 16.667 ms for a field deflection generator embodiment. Reference TF at the signal A indicates a period of time in which the line or field flyback pulse occurs which, for example, has a duration of 7 $\mu$s or 0.4 ms respectively. As the operation of the generator according to FIG. 1 is the same for the line deflection as for the field deflection for which only the value of some components need to be adapted, a line deflection generator will be described in the description which follows hereafter. The signal D occurring at the output 2 is a sawtooth signal which is produced at the line frequency and at the output 3 a parabolic signal E' occurs which is produced at the line frequency.

The input 1 is connected in series via a capacitor 4 and a resistor 5 to the base of an npn transistor 6 whose emitter is connected to a terminal having a supply voltage of $-12V$. The base of the transistor 6 is connected to ground through a resistor 7. The collector of the transistor 6 is connected in series through a resistor 8 and an adjustable resistor 9 to a terminal having a supply voltage $+6$ V. The node of the resistors 8 and 9 is connected to an inverting input $10_1$ of a difference amplifier 10, power supply terminals and connection networks having been omitted for simplicity. The output of the difference amplifier 10 is fed back to the inverting input $10_1$ through a capacitor 11 and a diode 12 connected in parallel therewith and applied in the pass direction. The output of the difference amplifier 10 is also connected directly to the output 2 and to a terminal having a voltage $-12V$ through a resistor 13 and to an inverting input $15_1$ of a difference amplifier 15 through a resistor 14. The output of the difference amplifier 15 is fed back through a capacitor 16 to the inverting input $15_1$ whilst a non-inverting input $15_2$ is connected directly to a reference potential which is equal to ground. The output of the difference amplifier 15 is connected to a collector of an npn transistor 17 whose emitter is connected to ground through a capacitor 18 and, through a diode 19, applied in the pass direction, to a non-inverting input $10_2$ of the difference amplifier 10. Through a resistor 20 the base of the transistor 17 is connected in series with the capacitor 21 to the input 1 and through a resistor 22 to a terminal having a supply voltage of $+6V$.

The output of the difference amplifier 15 has a fed-back circuit (17 to 19) to the non-inverting input $10_2$ of the difference amplifier 10 in which fed-back circuit the transistor 17 and the capacitor 18 constitute a peak-peak detection circuit (17, 18). Herein the transistor 17 must be of the bipolar type to be able to carry current into two directions depending on a higher or lower voltage at the output of the difference amplifier 15 with respect to the voltage across the capacitor 18. Instead of the transistor 17 which is controlled by switching pulses a diode might be applied but then a leakage resistor having a large value must be applied parallel to the capacitor 18. A disadvantage is that the dc voltage across the capacitor 18 would be less constant.

By means of its voltage drop $d$ the diode 19 ensures the temperature compensation of the voltage drop $d$ across the essentially present diode 12.

Through a resistor 23 the output of the difference amplifier 15 is furthermore connected to a terminal having a supply voltage $-12V$ and through a potentiometer 24 to ground, the tap of the potentiometer 24 being connected to the output 3 of the generator according to FIG. 1.

The following applied to the operation of the generator according to FIG. 1. Under the control of the signal A present at the input 1 the signal B of FIG. 2 is found at the collector of the transistor 6. Starting from the fact that the voltage $+U = +2V$ is present across the capacitor 18 (signal F of FIG. 2) it follows that a voltage $+U-d$ is found at the non-inverting input $10_2$ of difference amplifier 10, $d$ giving the voltage drop across the diode 19. If $d = 0.7$ V. the voltage at the input $10_2$ is $+U-d = +1.3$ V. The difference amplifier 10 (and also 15) has such a high input impedance for both inputs that the amplifier takes a negligible current and has such a high amplification that an input signal occurring at the input $10_1$ (or $15_1$) has a negligible amplitude. At the collector of the transistor 6 the signal B is found which has in the conducting state of the transistor 6 the voltage of substantially $-12V$ and in the non-conducting state of the transistor 6 the voltage $+u-d = +1.3V$.

The difference amplifier 10 constitutes together with the resistor 9, capacitor 11 and the diode 12 a first integrating circuit (9 to 12) by means of which the sawtooth signal D of FIG. 2 is formed from the pulse-shaped signal B. In FIG. 2, at the signal D it is indicated that the flyback retrace of the sawtooth which occurs from an instant $t_1$ in the period of time TF occurs until the voltage $+U$. This is achieved by the use of the diode 12 owing to which a voltage at the output of the difference amplifier 10 cannot rise to above the voltage at the input $10_1$ plus the voltage drop $d$ across the diode 12. As, as mentioned before, the voltage at the input $10_1$ is substantially equal to the voltage at the input $10_2$ at a magnitude of $+U-d$, the signal D retains the voltage $+U$ at the end of the period of time TF from an instant $t_2$ to an instant $t_3$. At the instant $t_3$ the transistor 6 is blocked under the control of the signal A which causes a constant current to flow through the resistor 9 to the capacitor 11 which is consequently charged, from which the negative-going edge of the trace (period of time TT−TF) of the sawtooth of the signal D at the output 2 of the difference amplifier 10 originates. The slope of the sawtooth can be adjusted by means of the variable resistor 9. At an instant $t_4$ situated in the middle of the trace having the period of time TT−TF, the ground potential is found for a moment in the sawtooth signal D whereafter the prolonged charging of the capacitor 11 results in a negative voltage in the signal D. At an instant $t_5$ the periodically occurring flyback starts as has already been described after the instant $t_1$. The voltage $-U$ is present in the sawtooth signal D at the instant $t_5$. The sawtooth signal D has a peak to peak value of 2 U $= 4V$ the D.C. component being equal to zero. This has been achieved by the feedback to the input $10_2$ from the output of the difference amplifier 15 and the input $15_2$ having the ground potential of 0 V. In case a voltage of another value is applied to the input $15_2$ it is present as the D.C. component.

The use of the resistor 13 is not relevant for the invention but the resistor 13 has been shown, as its application is necessary when the difference amplifier 10 is of a type having an emitter-follower output. The same applies to the resistor 23 and the difference amplifier 15. As such a difference amplifier embodiment is shown in an example of a circuit still to be given the resistors 13 and 23 are shown for completeness.

The first integrating circuit (9 to 12) is followed by a second integrating circuit (14 to 16). Starting from the sawtooth signal D of the FIG. 2 the parabolic signal E of FIG. 2 is found at the output of the amplifier 15. This has been achieved on the one hand by the feedback circuit (17 to 19) having the peak detection circuit (17,18) and on the other hand by the rating of the resistor 14 and the capacitor 16.

The peak detection circuit (17,18) in the feedback ensures that during the trace in the period of time TT−TF such a high D.C. voltage occurs at the capacitor 18 that the average value of the sawtooth signal D is at the reference potential which is present at the input $15_2$ of the difference amplifier 15. For the generator according to FIG. 1, which has the above-mentioned reference potential equal to the ground potential it follows that in the sawtooth signal D the D.C. component must be equal to the ground potential of 0 V. By means of the variable resistor 9 the peak to peak value (equal to 2U) of the sawtooth signal D is adjusted and when the generator according to FIG. 1 is in equilibrium, a trace from $+U$ to $-U$ follows. Reducing thereafter the resistor 9 results in a higher peak to peak value of, for example, 2U'. In the first instance the voltage $+U < +U'$ is still found at the capacitor 18. Then a negative D.C. voltage component occurs in the sawtooth signal D. With respect to the ground potential at the input $15_2$ of the difference amplifier 15 this negative D.C. component can not remain in existance owing to the feedback circuit (17 to 19) and an adjustment to the D.C. component equal to zero takes place. Ultimately, the voltage $+U' > +U$, which is also found in the signals E and F at the instants $t_3$ will be produced in the signal D between the instants $t_2$ and $t_3$. In association with the first (9 to 12) and the second integrating circuit (14 to 16) the peak detection circuit (17, 18) gives that the voltage in the signal E at the instant $t_3$ determines the substantially constant voltage shown in the signal F. To explain the control of the bipolar, bi-directional transistor 17 the signal C is shown in FIG. 2, whilst in the period of time TF the voltage $+U+d$ is found at the base under the influence of a base-emitter current and a consequent diode voltage drop $d$, which results in $+2.7$ V. When the capacitor 21 which was charged to a peak to peak value of 6 V (signal A) is discharged via the resistors 20 and 22 the transistor 17 remains blocked during the trace in the period of time $TT-TF$. A similar action occurs at the transistor 6, the capacitor 4 and the resistors 5 and 7.

The following will illustrate the importance of the rating of the resistor 14 and the capacitor 16. From the preceding it appears that the adjustment of variable resistor 9 determines the peak-peak value of sawtooth signal D having a D.C. component equal to zero. It follows for the value $+U$ in the signal D of FIG. 2 that the value $+U$ is also present in the parabolic signal E near the peak of the parabola in the period of time TF. For completeness it should be noted that in the period of time TF between the instants $t_1$ and $t_2$ a slope is produced which changes parabolically and that between the instants $t_2$ and $t_3$ a slope is produced in the signal E which changes linearly. With respect to the voltage $+U$ thus laid down a parabola is produced in the trace in the period of time $TT-TF$ whose amplitude depends on the values of the resistor 14 and the capacitor 16 starting from an infinite large amplification of the difference amplifier 15. By so rating the resistor 14 and the capacitor 16 that at the instant $t_4$ with the ground potential of 0 V in the signal D it is also present in the parabolic signal E, it is achieved that a changed adjustment of the variable resistor 9 which gives another value for $+U$ does not influence the zero value at the instant $t_4$ in the parabola. A result is that not only the ground potential is invariably present in the sawtooth signal D at the instant $t_4$, independent of the adjustment of the resistor 9, but is also applies to the parabolic signal E having the peak to peak value during the trace period $TT-TF$ which is equal to half that of the sawtooth signal D. In this way centering difficulties are avoided in the line or field deflection for which the signals D and E can be utilized.

At the output 2 the generator according to FIG. 1 supplies a sawtooth signal D which can be adjusted by means of the resistor 9. A changing sawtooth adjustment affects the peak to peak value of the parabolic signal E, whilst maintaining the zero value at the instant $t_4$, it being possible to obtain a desired adaptation of this peak to peak value through the potentiometer 24 so that the signal E' at the output 3 is obtained with any desired amplitude smaller than $+U$. A sawtooth or a parabolic voltage of the opposite phase can be obtained by using a phase invertor stage connected to the output 2 or 3. The use of amplitude adjusting and phase reversing stages connected to the output of the difference amplifier 10 or 15 offers the possibility, when the generator according to FIG. 1 is used in a television camera having a plurality, for example, three camera tubes that for each of the camera tubes the line or field deflection can be adjusted in an individual manner starting from a single generator.

By way of illustration the values of the types of components of the generator according to FIG. 1 suitable for use as a line deflection generator in a television system having a line period of 64 µs follow hereafter:

| Capacitor | 4 : 22 nF | Resistor | 5 : 470 Ω |
|---|---|---|---|
| | 11 : 3.3 nF | | 7 : 100 kΩ |
| | 16 : 1.5 nF | | 8 : 3.3k Ω |
| | 18 : 1.5 µF | | 9 : 30 kΩ |
| | 21 : 22 nF | | 13 : 1.5k Ω |
| Transistors 6 and 17 : type BC 54 | | | 14 : 12 kΩ |
| Diodes 12 and 19 : BAW 62 | | | 20 : 680 Ω |
| Difference amplifiers 10 and 15 : TCA 220 | | | 22 : 100 kΩ |
| | | | 23 : 1 kΩ |
| | | | 24 : 4.7k Ω |

The above values and types also apply to an embodiment as field deflection generator for a television system having a field period of 20 ms, excpet that:

| Capacitor | 4 : 6.8 vF | Resistor | 8 : 470 Ω |
|---|---|---|---|
| | 11 : 1 µF | | 14 : 10 k Ω |
| | 16 : 0.56 µF | | |
| | 18 : 47 µF | | |
| | 21 : 1 µF | | |

What is claimed is:

1. A generator for producing a sawtooth and a separate parabolic signal, said generator comprising a first integrating circuit, a second integrating circuit direct current coupled to said first circuit, each circuit comprising a difference amplifier and a capacitor in a feedback path from an output to an inverting input of the same difference amplifier, and a peak detection circuit coupled from the second circuit difference amplifier output to a non-inverting input of the difference amplifier in the first integrating circuit.

2. A generator as claimed in claim 1, wherein the second integrating circuit comprises component means selected to provide a peak to peak value of the parabolic signal during the trace portion of the sawtooth substantially half that of the sawtooth signal, the non-inverting input of the difference amplifier in the second integrating circuit being connected directly to a reference potential.

3. A generator as claimed in claim 2, wherein said reference potential is ground potential.

4. A generator as claimed in claim 1 further comprising a first diode coupled in parallel with the capacitor in the first integrating circuit, and a second diode coupled between the peak detection circuit and the non-inverting input of the difference amplifier in the first integrating circuit, which diodes have the same pass direction with respect to the relevant input of the difference amplifier in said first circuit.

5. A generator as claimed in claim 1, wherein the peak detection circuit comprises a bipolar transistor having a base means for receiving switching pulses, and a collector-emitter path coupled between the output of the difference amplifier in the second integrating circuit and the non-inverting input of the difference amplifier in the first integrating circuit, the emitter being coupled to ground by a capacitor.

6. A generator as claimed in claim 1, further comprising a potentiometer coupled to the output of the difference amplifier in the second integrating network, and a generator output means for supplying the parabolic signal coupled to said potentiometer.

* * * * *